United States Patent
Beall et al.

(10) Patent No.: US 9,240,568 B2
(45) Date of Patent: Jan. 19, 2016

(54) OPAL GLASSES FOR LIGHT EXTRACTION

(71) Applicants: George Halsey Beall, Big Flats, NY (US); Ivan A Cornejo, Corning, NY (US); Adam James Ellison, Painted Post, NY (US); Glenn Eric Kohnke, Corning, NY (US); Lisa Ann Lamberson, Painted Post, NY (US)

(72) Inventors: George Halsey Beall, Big Flats, NY (US); Ivan A Cornejo, Corning, NY (US); Adam James Ellison, Painted Post, NY (US); Glenn Eric Kohnke, Corning, NY (US); Lisa Ann Lamberson, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 11 days.

(21) Appl. No.: 13/669,715

(22) Filed: Nov. 6, 2012

(65) Prior Publication Data

US 2013/0119356 A1    May 16, 2013

Related U.S. Application Data

(60) Provisional application No. 61/558,101, filed on Nov. 10, 2011.

(51) Int. Cl.
   *H01L 51/52*    (2006.01)
(52) U.S. Cl.
   CPC ..... *H01L 51/5268* (2013.01); *H01L 2933/0091* (2013.01)
(58) Field of Classification Search
   CPC ............. H01L 27/14625; H01L 2933/0091; H01L 51/5268
   USPC ........................................ 257/13, 214, 40, 98
   See application file for complete search history.

(56) References Cited

U.S. PATENT DOCUMENTS

| | | | |
|---|---|---|---|
| 3,645,711 A | 2/1972 | Pirooz et al. | |
| 3,709,705 A | 1/1973 | Hagedorn et al. | |
| 3,849,097 A | 11/1974 | Giffen et al. | |
| 3,920,462 A | 11/1975 | Flannery et al. | |
| 4,017,289 A | 4/1977 | Hoda | |
| 4,038,448 A * | 7/1977 | Boyd ................. | C03C 4/005 428/212 |
| 4,134,747 A | 1/1979 | Pierson et al. | |
| 4,298,390 A | 11/1981 | Flannery et al. | |
| 4,309,218 A | 1/1982 | Flannery et al. | |
| 4,309,219 A | 1/1982 | Flannery et al. | |
| 4,311,529 A | 1/1982 | Danielson et al. | |
| 4,323,653 A | 4/1982 | Holland et al. | |
| 4,328,299 A | 5/1982 | Beall et al. | |
| 4,331,769 A | 5/1982 | Danielson et al. | |
| 4,376,170 A | 3/1983 | Wiker | |
| 4,427,429 A | 1/1984 | Tiilikka | |
| 4,439,528 A | 3/1984 | Araujo | |
| 4,469,799 A | 9/1984 | Dumbaugh, Jr. | |
| 4,532,223 A | 7/1985 | Barlier et al. | |
| 4,536,480 A | 8/1985 | Flannery et al. | |
| 4,536,481 A | 8/1985 | Flannery et al. | |

(Continued)

*Primary Examiner* — Jaehwan Oh
(74) *Attorney, Agent, or Firm* — Jason A. Barron

(57) ABSTRACT

Opal glass compositions and devices incorporating opal glass compositions are described herein. The compositions solve problems associated with the use of opal glasses as light-scattering layers in electroluminescent devices, such as organic light-emitting diodes. In particular, embodiments solve the problem of high light absorption within the opal glass layer as well as the problem of an insufficiently high refractive index that results in poor light collection by the layer. Particular devices comprise light-emitting diodes incorporating light scattering layers formed of high-index opal glasses of high light scattering power that exhibit minimal light attenuation through light absorption within the matrix phases of the glasses.

16 Claims, 5 Drawing Sheets

(56) References Cited

U.S. PATENT DOCUMENTS

| | | |
|---|---|---|
| 4,634,683 A | 1/1987 | Dumbaugh, Jr. |
| 4,666,869 A | 5/1987 | Dumbaugh, Jr. |
| 4,687,751 A | 8/1987 | Barlier et al. |
| 4,767,725 A | 8/1988 | Mizutani et al. |
| 4,818,731 A | 4/1989 | Mizutani et al. |
| 5,019,538 A | 5/1991 | Borrelli et al. |
| 5,116,787 A | 5/1992 | Dumbaugh, Jr. |
| 5,116,788 A | 5/1992 | Dumbaugh, Jr. |
| 5,122,484 A | 6/1992 | Beall et al. |
| 5,408,489 A * | 4/1995 | Kugler ............... H01S 3/225 359/359 |
| 5,432,130 A | 7/1995 | Rheinberger et al. |
| 5,591,683 A | 1/1997 | Stempin et al. |
| 6,001,754 A | 12/1999 | Fosse et al. |
| 6,200,137 B1 | 3/2001 | Holland et al. |
| 6,280,863 B1 | 8/2001 | Frank et al. |
| 6,319,867 B1 | 11/2001 | Chacon et al. |
| 6,524,703 B1 | 2/2003 | Court |
| 6,753,279 B2 | 6/2004 | Kohli |
| 6,831,029 B2 | 12/2004 | Chacon et al. |
| 6,992,030 B2 | 1/2006 | Paulson |
| 7,161,292 B2 | 1/2007 | Leo |
| 7,189,672 B2 | 3/2007 | Aitken et al. |
| 7,299,657 B2 | 11/2007 | Kohli |
| 7,365,038 B2 | 4/2008 | Chacon et al. |
| 7,386,999 B2 | 6/2008 | Fenn et al. |
| 7,400,439 B2 | 7/2008 | Holman |
| 2002/0058119 A1* | 5/2002 | Mihara ............... G11B 7/248 428/64.4 |
| 2004/0066363 A1 | 4/2004 | Yamano et al. |
| 2005/0094127 A1* | 5/2005 | O'mahony ......... A61B 5/14557 356/39 |
| 2007/0031633 A1* | 2/2007 | Satoh ................. C23C 14/0036 428/64.4 |
| 2007/0195056 A1 | 8/2007 | Lloyd |
| 2007/0211460 A1 | 9/2007 | Ravkin |
| 2007/0234759 A1* | 10/2007 | Sakoske ............... C03B 27/012 65/33.1 |
| 2008/0043466 A1 | 2/2008 | Chakmakjian et al. |
| 2008/0084365 A1 | 4/2008 | Takajara et al. |
| 2008/0090034 A1* | 4/2008 | Harrison ............... B41M 5/385 428/32.71 |
| 2008/0100210 A1 | 5/2008 | Custodis |
| 2008/0286548 A1 | 11/2008 | Ellison et al. |
| 2010/0215862 A1* | 8/2010 | Gomez ................. C03C 21/002 427/419.4 |

* cited by examiner

OPAL GLASSES FOR LIGHT EXTRACTION

This application claims the benefit of priority under 35 U.S.C. §119 of U.S. Provisional Application Ser. No. 61/558,101 filed on Nov. 10, 2011 the content of which is relied upon and incorporated herein by reference in its entirety.

BACKGROUND

Light-emitting diodes (LEDs), particularly including organic light emitting diodes (OLEDs), are of great interest for both display and lighting applications. However, due to the high refractive index of OLED materials, reduced light outputs caused by light trapping within either the OLED materials or other material layers within the devices remain a significant problem.

A number of light-scattering approaches for improving the extraction of light from LED and OLED devices have been proposed. These include, in addition to the use of roughened light scattering surface layers, resin covering layers containing light-scattering inclusions, bonded ceramic covering layers of light-scattering particles, and layers formed of opal or other light-scattering glasses. Each of these proposed solutions presents its own problems, however, including increased materials costs, limited layer durability, and/or added processing complexity.

Opal glasses typically comprise one or more light-scattering phases evenly dispersed in a fully encapsulating glass matrix. It was thought that this combination of features could provide an impermeable, durable and stable light scattering material for OLED applications. However such glasses have not found substantial commercial use for these applications due to a number of actual and potential problems. Significant shortcomings of conventional opal glasses include, for example, a relatively low refractive index absent the use of expensive, index-increasing glass modifiers, a need in some cases to use supplemental heat treatments to develop a useful level of light scattering at low glass thicknesses, and undesirable light attenuation by the matrix glass or light-scattering phase(s) in glass layers of higher thickness.

SUMMARY

Although the light emission requirements for display and lighting applications vary considerably, both would benefit from improved light extraction from such devices. Embodiments described herein provide a solution to many of the problems connected with the use of opal glasses as light-scattering layers in electroluminescent devices such as LEDs and OLEDs. In particular, embodiments solve the problem of high light absorption within the opal glass layer as well as the problem of an insufficiently high refractive index that results in poor light collection by the layer. Particular embodiments comprise light-emitting diodes incorporating light scattering layers formed of high-index opal glasses of high light scattering power that exhibit minimal light attenuation through light absorption within the matrix phases of the glasses.

Some embodiments comprise an electroluminescent device such as a light emitting diode comprising a light-scattering layer for enhancing the extraction of light from the device, wherein the light-scattering layer comprises an opal glass having a refractive index greater than 1.6. Further, the properties of the opal glass may comprise a matrix attenuation coefficient below 1 $cm^{-1}$ at a light wavelength of 400 nm, e.g., an attenuation coefficient below 0.4 $cm^{-1}$, or even below 0.04 $cm^{-1}$, in some embodiments.

Further embodiments comprise an OLED or LED device comprising adjoining electron transport and hole transport layers, a transparent electrode in contact with at least one of the transport layers, and a light-scattering layer in contact with the transparent electrode, wherein the light-scattering layer comprises an opal glass of $Li_2O$—$TiO_2$—$SiO_2$ composition or $Li_2O$—$TiO_2$—$SiO_2$—$P_2O_5$ composition, the glass comprising a vitreous or amorphous $TiO_2$ light-scattering phase, having a refractive index greater than 1.6 and having an attenuation coefficient not exceeding 0.04 $cm^{-1}$ at a light wavelength of 400 nm.

Opal glasses comprising a $Li_2O$—$TiO_2$—$SiO_2$ or $Li_2O$—$TiO_2$—$SiO_2$—$P_2O_5$ composition offer unique advantages as light-scattering materials for improving light extraction from OLED devices. In some embodiments, the $TiO_2$ constituent of these glasses performs a dual function, acting to increase the refractive index of the glass as well as to provide an efficient light-scattering $TiO_2$ phase as the glass is cooled from the melt. The $TiO_2$-containing phases in these glasses, which may comprise a vitreous or crystalline structure depending on the thermal history of the glass, can in many cases be formed without supplemental heat treatments, and are sufficiently dense that a high degree of light scattering can be secured even at very low glass thicknesses.

Further embodiments comprise opal glass sheet of $Li_2O$—$TiO_2$—$SiO_2$ or $Li_2O$—$TiO_2$—$SiO_2$—$P_2O_5$ composition. In some embodiments, the glass sheet comprises $Li_2O$, $TiO_2$, $SiO_2$, and, optionally, $P_2O_5$. In some embodiments, the glass sheet consists predominantly of $Li_2O$, $TiO_2$, $SiO_2$, and, optionally, $P_2O_5$. By consisting predominantly is meant that the disclosed oxides make up at least about 65, 70, 75, or 80% by weight of the glass forming the sheet. The opal glass sheet comprises a vitreous or crystalline $TiO_2$ light scattering phase and has a thickness not exceeding about 500 μm, 400, 300, 200, 100, or in some embodiments not exceeding 50 μm, a refractive index of at least 1.6, 1.7, 1.8, 1.9, or 2.0, and an attenuation coefficient below about 0.01, 0.02, 0.03, 0.04, 0.05, 0.06, 0.07 or 0.08 $cm^{-1}$ at a light wavelength of 400 nm. Such sheets can serve as device-supporting substrates or as light-scattering covering layers for OLED devices.

BRIEF DESCRIPTION OF THE DRAWINGS

Embodiments are further described below with reference to the appended drawings, wherein.

DETAILED DESCRIPTION

Figure 1:
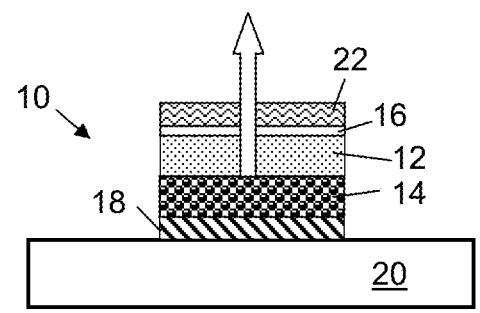
FIG. 1 is a schematic illustration of a design for top-emitting OLED device.

The problem of light trapping in OLEDs is well known. In the so-called top-emission device design wherein the light is emitted upwardly from a device disposed on a light-reflecting substrate, a very large percentage of the generated light can be trapped in upper device layers, including OLED or electrode layers, which are typically of higher refractive index than protective covering layers or the surrounding atmosphere. Ideally, a device covering layer of equal or higher refractive index than, for example, the top electrode layer can promote the efficient collection of light emitted through the electrode, but some means for efficiently extracting light from the device covering layer is still required.

In bottom-emission device designs the bottom OLED layer is typically in contact with a transparent bottom electrode disposed on a transparent substrate composed, for example, of glass. The bottom electrode is generally of relatively high refractive index in comparison to the glass substrate, however, so trapping of generated light within OLED layers or the electrode can again occur. In accordance with one study, a bottom emission diode design evaluated using a classical ray model calculated that 51% of the initially generated light is trapped within the active organic and electrode layers, 31.5% of the light is trapped within the glass substrate, and only 17.5% of the light is coupled out into the air. Thus, in both bottom- and top-emission device designs, some means for reducing internal reflections and allowing more of the generated light to be emitted from the diode structures is needed.

The benefits of more efficient light extraction from OLEDs and other electroluminescent devices go beyond increasing light emission at a given operating power level. The service lives of such devices are influenced by device drive voltages. Therefore, improving the light extraction efficiency of such devices would allow operation at lower power levels while achieving the same light outputs. A properly engineered light scattering system, whether in the form of a surface scattering layer or a bulk scattering material, can significantly improve light extraction from these devices.

While the opal glass light-scattering layers disclosed in accordance with the present description can be employed to improve the function of a wide variety of light-emitting electroluminescent devices, they offer particular advantages when incorporated into LED and OLED devices. Accordingly, the following descriptions include specific illustrative embodiments of OLED designs even though the benefits are not limited thereto.

The opal glass materials employed in accordance with the present disclosure typically comprise at least two phases, with the major phase in particular embodiments comprising a silicate glass phase of $Li_2O$—$TiO_2$—$SiO_2$ composition. In some embodiments, a $Li_2O$—$TiO_2$—$SiO_2$ glass phase comprises a phase wherein the glass comprises $Li_2O$, $TiO_2$, and $SiO_2$, i.e., with those oxides making up at least about 65, 70, 75, or 80% by weight of the glass. The light-scattering phase of $TiO_2$ generally comprises only a minor volume fraction (i.e., less than 10% by volume) of the material.

Most opal glasses within the above ranges of composition have melting temperatures not exceeding 1400° C., making them well suited for manufacture by conventional melting and forming methods. Thus they can be conveniently formed into glass sheets within a thickness range, for example, of about 50-500 μm, or about 50, 100, 200, 300, 400, or 500 nm thick. Such thicknesses provide a level of light scattering that is sufficient to significantly improve light extraction from current OLED devices even where relatively rapid quenching of the glass during sheet-forming is employed. Moreover, controlling the thermal history of the glass permits tuning of the opacity during forming, securing scattering through the thicknesses of the glass layers as appropriate for any particular device application.

Securing a light attenuation below about 0.01, 0.02, 0.03, 0.04, 0.05, 0.06, 0.07 or 0.08 cm$^{-1}$ at a light wavelength of 400 nm in these glasses requires that the concentration of light-attenuating species in the glass, particularly including light absorbing transition metals such as iron, be controlled. For that reason opal glass sheet herein, as well as the light-scattering opal glass layers in the OLED devices, will generally have compositions comprising less than about 0.5, 0.4, 0.3, 0.2, 0.1, or 0.05% total weight of oxides of iron, nickel, chromium, and manganese. The use of low-iron silica sources such as low-iron sand can help to achieve the necessary limitations on transition metal oxide levels.

Particular embodiments of opal glass compositions for glass sheets and device layers provided in accordance with the present description comprise those wherein the opal glasses have compositions comprising, in weight percent, about 60-85 $SiO_2$, 10-30 $TiO_2$, and 5-15 $Li_2O$. In addition, however, the glasses may further comprise conventional glass modifiers in limited proportions to the extent not adversely affecting the light-scattering efficiencies of the glasses. As specific examples, these glasses may further comprise, in weight percent, up to about 10% total of oxides selected from the group consisting of $B_2O_3$, $Al_2O_3$, $Na_2O$ $K_2O$, and/or CaO, and up to about 5% total of oxides selected from the group consisting of MgO and $Al_2O_3$. The opal glass compositions may further comprise conventional glass fining aides such as $As_2O_3$ and/or $Sb_2O_3$.

Depending upon the particular device designs selected for the inclusion of light-scattering layers as herein disclosed, the use of opal glasses having refractive indices even higher than about 1.6, 1.7, 1.8, 1.9, or 2.0, may be advantageous. Opal scattering layers intended for use in OLED devices incorporating transparent electrodes of very high refractive index should be of higher refractive index. For these applications it can be useful to modify the compositions of the disclosed $Li_2O$—$TiO_2$—$SiO_2$ glasses by adding refractive-index-increasing constituents to the glass. Particular embodiments of such compositions include those wherein the opal glass further contains at least one refractive-index-modifying constituent selected from the group consisting of $La_2O_3$, $Nb_2O_5$, $Ta_2O_5$, PbO and $Bi_2O_3$. Opal glass sheets and device layers having refractive indices of at least 1.7, or in some embodiments at least 1.8, are examples of higher index scattering layers of tuned refractive index that can readily be provided through the use of such constituents.

As noted above, light-scattering opal glass sheets or layers provided in accordance with the present description can be advantageously employed in a wide variety of OLED device designs. These include use in direct contact with top-emission and bottom-emission OLED devices, or as covering and/or encapsulating layers for the electrodes used in such devices. Light-scattering opal glass sheets can also provide device-supporting substrates, for example, in bottom-emission OLED device configurations.

Figure 2:
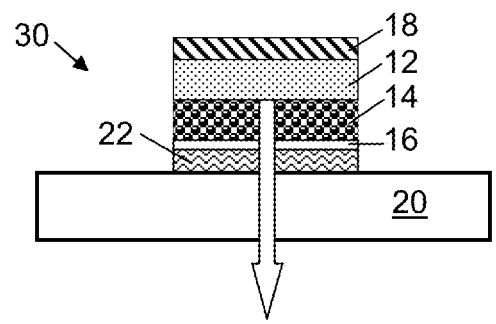
FIG. 2 is a schematic illustration of a design for a bottom-emitting OLED device.
Figure 3:
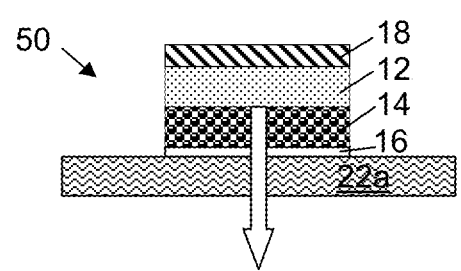
FIG. 3 is a schematic illustration of a second design for a bottom-emitting OLED device.

Illustrative examples of OLED device designs incorporating light-scattering opal glass light extraction layers or substrates in accordance with the disclosure are schematically illustrated in FIGS. 1-3 of the drawings. FIG. 1 presents a schematic cross-sectional view, not in true proportion or to scale, of a top-emitting OLED device 10, the predominant direction of light emission from the device being indicated by the upwardly directed arrow in the figure.

Device 10 comprises an electron transport layer 12 disposed on and in electrical contact with a hole transport layer 14 to form a light-emitting junction. Layer 12 is covered by and in electrical contact with transparent electrode 16 while layer 14 is in electrical contact with opposite light-reflecting electrode 18, those electrodes operating to power the device. All of the layers are supported on a device substrate 20.

In accordance with the present disclosure, device 10 is further provided with a light-scattering opal glass covering layer 22, that layer being disposed over and in contact with transparent electrode 16. The opal glass layer operates to collect and then scatter light traversing the transparent electrode when the device is activated, thereby increasing the amount of light extracted from the device.

FIG. 2 of the drawings presents a similar schematic cross-sectional view of a bottom-emitting OLED device 30, the predominant direction of light emission from the device being indicated by the downwardly directed arrow in the figure. Device 30 again incorporates an electron transport layer 12 in contact with a hole transport layer 14 to provide a light-emitting junction. In the case of device 30, however, light reflecting electrode 18 is disposed over electron transport layer 12 while transparent electrode 16 is disposed beneath hole transport layer 14 to allow for the collection and downward emission of light generated within the device.

Also included in device 30 in accordance with the present disclosure is a light-scattering opal glass layer 22, disposed between transparent electrode 18 and a transparent device substrate 20. Light-scattering layer 22 operates to extract and downwardly scatter light emitted from the diode junction that collects within transparent electrode 18. Thus the amount of light directed into and downwardly traversing transparent substrate 20 is increased by layer 22.

FIG. 3 of the drawings presents a schematic cross-sectional view of an alternative bottom-emitting OLED device 50, the predominant direction of light emission from the device again being indicated by the downwardly directed arrow in the drawing. The arrangement of electron and hole transport layers 12 and 14 as well as the positioning of transparent electrode 20 and light-reflecting electrode 18 in device 50 are analogous to the arrangements and positioning employed in the design of device 30. However, device substrate 22a in device 50 provides a dual function in the OLED design, providing both a substrate for supporting the device and a light-scattering functionality for the purpose of increasing the amount of light emitted by the device. For those purposes substrate 22a comprises a thin sheet of a $Li_2O$—$TiO_2$—$SiO_2$ opal glass incorporating a light-scattering TiO2 phase as disclosed above, that sheet acting to extract light from transparent electrode 20 and scatter it downwardly from the device.

Illustrative examples of glass compositions suitable for providing light-scattering opal glass layers or substrates within the scope of the present description are set forth in Table 1 below. The glass compositions are reported in parts by weight on the oxide basis as calculated from the batches for melting the glasses.

TABLE 1

Opal Glass Compositions

| Sample ID Oxide Component | Glass A (% wt) | Glass B (% wt) |
|---|---|---|
| $SiO_2$ | 59.84 | 31.47 |
| $TiO_2$ | 24.93 | 4.66 |
| $Li_2O$ | 9.97 | 0 |
| $B_2O_3$ | 4.99 | 0 |
| $Sb_2O_3$ | 0.5 | 0 |
| $Al_2O_3$ | 0 | 11.11 |
| MgO | 0 | 8.25 |
| ZnO | 0 | 0.56 |
| $P_2O_5$ | 0 | 43.86 |

In a typical glass manufacturing procedure, batches for the above glasses are compounded, ball-milled, and melted in platinum crucibles at 1400° C. The melts are then cast into glass sheets and annealed at about 490° C. to provide stress-free glass castings.

The light-transmitting characteristics of the glasses thus provided are evaluated by conducting light transmission measurements on opal glass sheets of known thickness. Measurements are taken on both glass samples as initially cast, and on similar samples subjected to supplemental heat treatments to maximize the development of light-scattering $TiO_2$ phases in the glasses. Due to the rapid development of light-scattering phases in these glasses, even the samples as cast can exhibit a relatively high degree of opacity due to light scattering. As noted above, a wide range of scattering levels can be produced in these glasses, both through variations in composition and variations in the thermal history of the glass as affected by variations in the forming methods and heat treatments used in manufacture.

Figure 4:
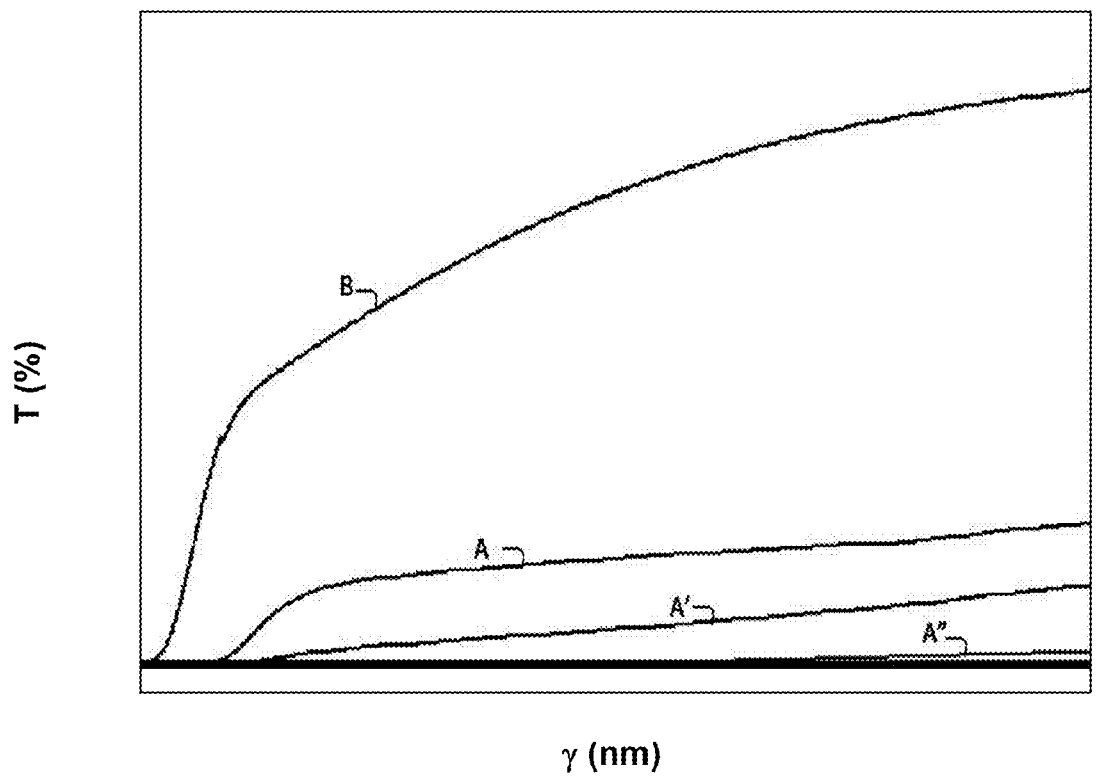
FIG. 4 is a graph plotting light transmission through selected light-scattering opal glasses.

FIG. 4 of the drawings illustrates the range of variations in light transmission that can be exhibited by the glasses set forth in Table 1. FIG. 4 is a graph presenting curves plotting the light transmissions of samples of these glasses over the wavelength range of visible light as reported on the horizontal axis of the graph. The measured levels of light transmission through the samples are reported in percent transmission on the vertical axis of the graph.

Transmission Curve A in FIG. 4 plots light transmission through a 1.2 mm thick sample of Glass A from Table 1 above as cast from the melt, while transmission Curves A' and A"reflect light transmission through samples of the same glasses, at thicknesses of 0.17 mm and 0.175 mm, respectively, after four-hour heat treatments at 600° C. and 650° C., respectively. Curve B plots light transmission values as measured on a 0.125 mm thick sample of Glass B from Table 1 as cast from the melt. The extensive development of light-scattering TiO2 phases indicated by the transmission measurements on these glasses confirm that even very thin opal glass layers or substrates are all that will be required to achieve high levels of light scattering and light extraction from OLEDs and other electroluminescent devices incorporating such glasses.

Figure 5A:
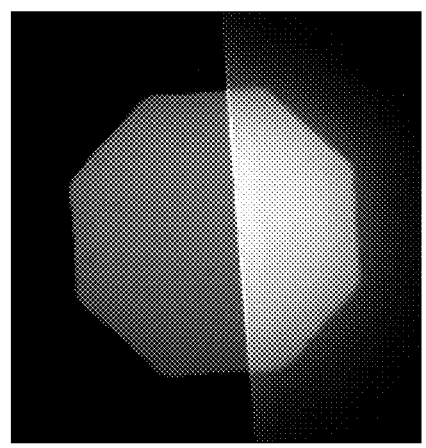
FIGS. 5A and 5B comprise a photomicrograph and corresponding light intensity data for an electroluminescent sample with no opal glass cover sheet (left hand side) and with an embodied opal glass cover sheet (right hand side)
Figure 5B:
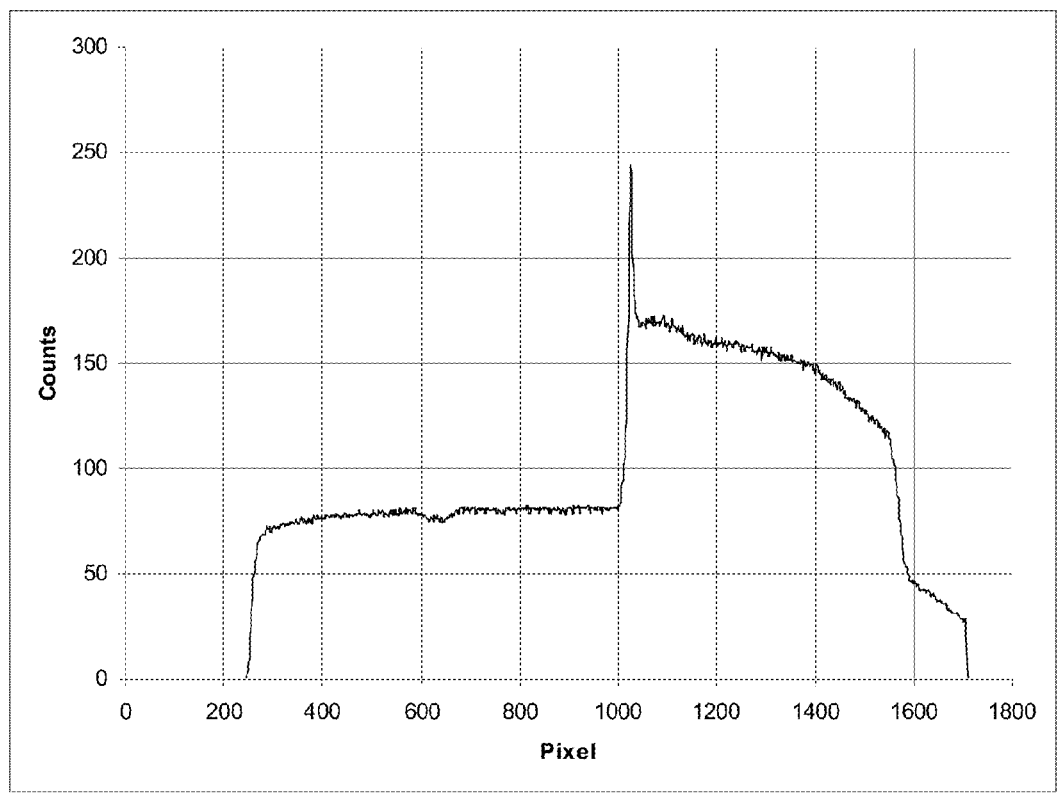

The effectiveness of light-scattering $Li_2O$—$TiO_2$—$SiO_2$ opal glass layers for enhancing the extraction of light from electroluminescent devices is shown by the emitted light intensity data presented in FIGS. 5a and 5b of the drawings. Each of those figures comprises a photomicrograph resulting from a three-second exposure to a photoluminescent sample during activation by a UV light source. Each figure further comprises a plot of the light extraction data as measured from the photomicrograph.

Figure 6A:
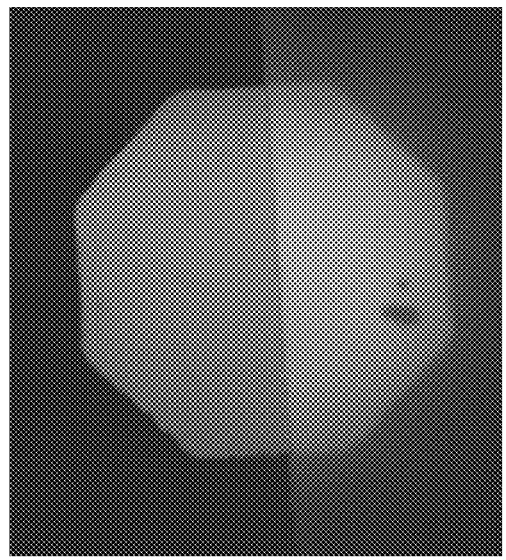
FIGS. 6A and 6B comprise a photomicrograph and corresponding light intensity data for an electroluminescent sample with no opal glass cover sheet (left hand side) and with an embodied opal glass cover sheet (right hand side)

Preparation of the photoluminescent samples for measurement comprises providing each sample with a coating of index-matching oil and then covering the right-hand segments of each sample with a light-scattering opal glass sheet of the Glass A composition reported in Table 1 above. The opal glass sheet employed in FIG. 5A is of 100 μm thickness and the sheet in FIG. 6A is of 200 μm thickness.

Figure 6B:
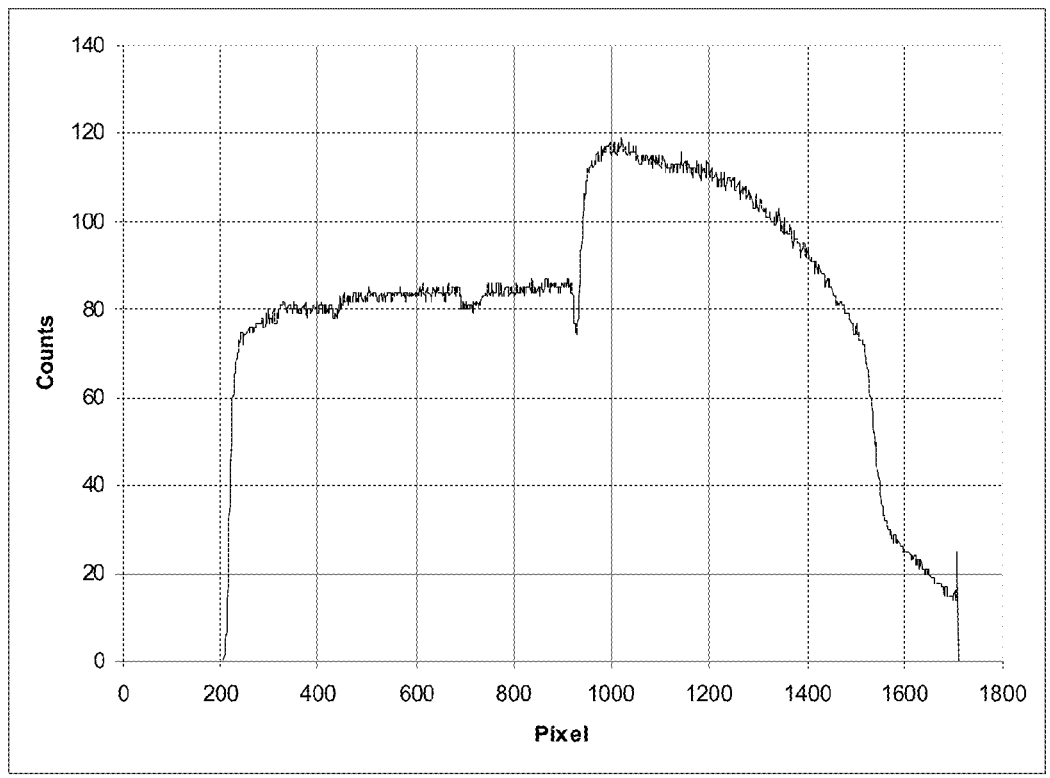

The relative light extraction efficiencies of the two samples are indicated by the enhanced brightness of the opal-glass-covered right-hand segments of the illuminated fields shown in the photomicrographs (FIGS. 5B and 6B). The data plotted in the graphs show a brightness enhancement of 2.1× for the 100 μm opal glass sample of FIG. 5A, and an enhancement of 1.4× for the 200 um opal glass sample of FIG. 6A. The marked enhancements in light extraction provided by both of the light-scattering opal glass sheets are evident from these figures.

Figure 7:
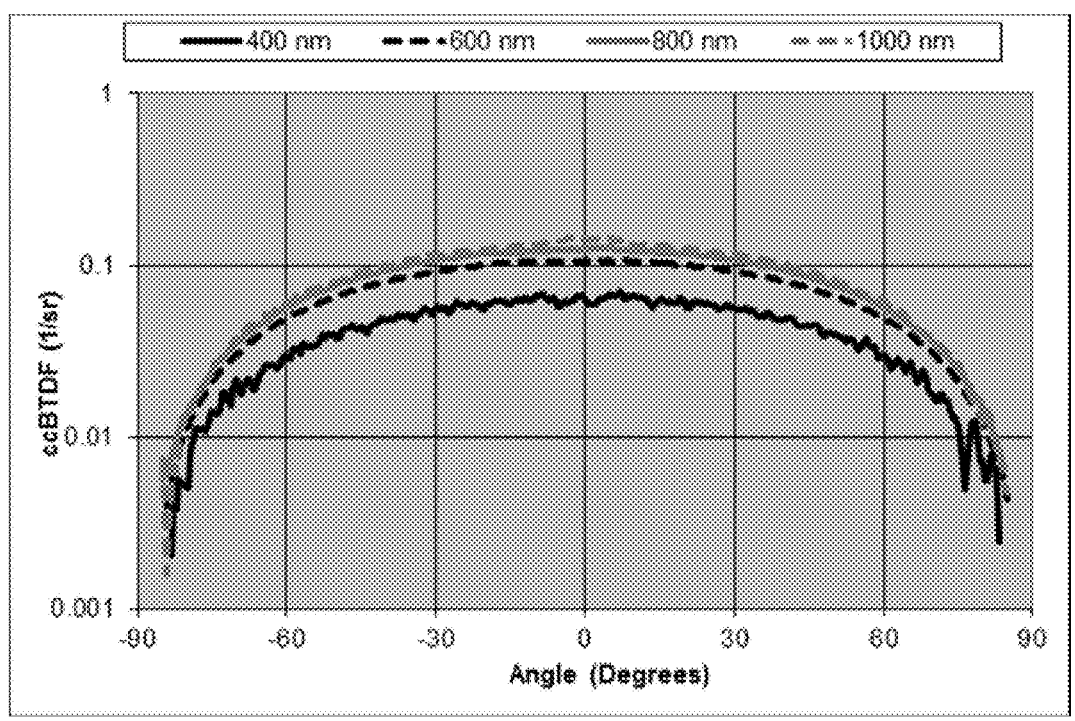
FIG. 7 present light scattering data for a selected light-scattering opal glass.

Yet a further advantage imparted to OLED devices provided in accordance with particular embodiments is that the opal glass light-scattering layers comprising the $TiO_2$ light-scattering phases are essentially free of specular transmission and exhibit substantially wavelength-independent Lambertian scattering. FIG. 7 of the drawings plots the value of the bidirectional transmittance distribution function (ccBTDF) for transmitted light scattered over scattering angles from −90° to +90° through a 0.1 mm-thick sample of an opal glass having the composition of Glass A from Table 1 above. Uniform (Lambertian) scattering is shown at each of the plotted blue (400 nm), green (600 nm), orange (800) and red (1000) light wavelengths, with all plots being absent intensity peaks at 0° which would be indicative of specular transmission through the sample.

While the disclosure has referenced particular embodiments of OLED devices and light-scattering opal glass layers and substrates, it will be apparent from those descriptions that the embodiments presented are merely illustrative of the various devices and glasses that may be selected by those of skill in the art for the practice of embodiments within the scope of the appended claims.

As used herein, the singular forms "a," "an" and "the" include plural referents unless the context clearly dictates otherwise. Thus, for example, reference to a "metal" includes examples having two or more such "metals" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of substituents A, B, and C are disclosed as well as a class of substituents D, E, and F, and an example of a combination embodiment, A-D is disclosed, then each is individually and collectively contemplated. Thus, in this example, each of the combinations A-E, A-F, B-D, B-E, B-F, C-D, C-E, and C—F are specifically contemplated and should be considered disclosed from disclosure of A, B, and C; D, E, and F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to any components of the compositions and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed It will be apparent to those skilled in the art that various modifications and variations can be made to the present disclosure without departing from its spirit and scope. Since modifications combinations, sub-combinations and variations of the disclosed embodiments incorporating the spirit and substance of the disclosure may occur to persons skilled in the art, the disclosure should be construed to include everything within the scope of the appended claims and their equivalents.

What is claimed is:

1. An opal glass sheet of $Li_2O$—$TiO_2$—$SiO_2$ or $Li_2O$—$TiO_2$—$SiO_2$—$P_2O_5$ composition for use in an electroluminescent device comprising a vitreous or crystalline $TiO_2$ light scattering phase and having a thickness not exceeding 500 μm, a refractive index of at least 1.6, and attenuation coefficient below 0.04 $cm^{-1}$ at a light wavelength of 400 nm.

2. An opal glass sheet in accordance with claim 1 having a composition containing, in weight percent, less than 0.1% total of oxides of transition metals selected from the group consisting of iron, nickel, chromium and manganese.

3. An opal glass sheet in accordance with claim 1 having a thickness not exceeding 500 μm and having a refractive index of at least 1.8.

4. An opal glass sheet in accordance with claim 1 having a composition comprising, in weight percent, about 60-85 $SiO_2$, 10-30 $TiO_2$, and 5-15 $Li_2O$.

5. An opal glass sheet in accordance with claim 4 further comprising, in weight percent, up to about 10% total of oxides selected from the group consisting of $B_2O_3$, $Al_2O_3$, $Na_2O$ $K_2O$, and/or CaO, and up to about 5% total of oxides selected from the group consisting of MgO and $Al_2O_3$.

6. An opal glass sheet in accordance with claim 4, wherein the opal glass sheet comprises a silicate glass phase of $Li_2O$—$TiO_2$—$SiO_2$ composition, and wherein the silicate glass phase contains at least one refractive-index-modifying constituent selected from the group consisting of $La_2O_3$, $Nb_2O_5$, $Ta_2O_5$, PbO and $Bi_2O_3$.

7. An opal glass sheet in accordance with claim 4 having a melting temperature not exceeding 1400° C.

8. An opal glass sheet in accordance with claim 4 having a thickness in the range of 50-100 μm.

9. An electroluminescent device comprising a light-scattering layer for enhancing the extraction of light from the device, wherein the light-scattering layer comprises an opal glass sheet according to claim 1.

10. An OLED device comprising adjoining electron transport and hole transport layers, a transparent electrode in contact with at least one of the transport layers, and a light-scattering layer in contact with the transparent electrode, wherein the light-scattering layer comprises the opal glass sheet according to claim 1.

11. An OLED device in accordance with claim 10, wherein the opal glass sheet has a composition comprising less than 0.1% total weight of oxides of iron, nickel, chromium, and manganese.

12. An OLED device in accordance with claim 10, wherein the opal glass sheet has a refractive index of at least 1.8.

13. An OLED device in accordance with claim 10, wherein the opal glass sheet has a composition comprising, in weight percent, about 60-85% $SiO_2$, 10-30% $TiO_2$, and 5-15% $Li_2O$.

14. An OLED device in accordance with claim 13, wherein the opal glass sheet further comprises, in weight percent, up to about 10% total of oxides selected from the group consisting of $B_2O_3$, $Al_2O_3$, $Na_2O$ $K_2O$, and/or CaO, and up to about 5% total of oxides selected from the group consisting of MgO and $Al_2O_3$.

15. An OLED device in accordance with claim 13, wherein the opal glass further comprises at least one refractive-index-modifying constituent selected from the group consisting of $La_2O_3$, $Nb_2O_5$, $Ta_2O_5$, PbO and $Bi_2O_3$.

16. An OLED device in accordance with claim 10, wherein the opal glass light-scattering layer comprising the $TiO_2$ light-scattering phase is free of specular transmission and exhibits substantially wavelength-independent Lambertian scattering.

* * * * *